United States Patent [19]

Satoh

[11] 4,309,961
[45] Jan. 12, 1982

[54] APPARATUS FOR THERMAL TREATMENT OF SEMICONDUCTORS

[75] Inventor: Ryozo Satoh, Yamato, Japan

[73] Assignee: Tel-Thermco Engineering Co., Ltd., Yokohama, Japan

[21] Appl. No.: 132,734

[22] Filed: Mar. 24, 1980

[30] Foreign Application Priority Data

Mar. 29, 1979 [JP] Japan .................................. 54-36259

[51] Int. Cl.³ .............................................. C83C 13/08
[52] U.S. Cl. ..................................... 118/733; 432/250
[58] Field of Search ............... 432/188, 198, 200, 250; 118/719, 733, 900; 427/255.2, 255.3, 255.4

[56] References Cited

U.S. PATENT DOCUMENTS

| | | | |
|---|---|---|---|
| 3,441,000 | 4/1969 | Burd et al. | 118/719 |
| 3,517,643 | 6/1970 | Goldstein et al. | 118/715 |
| 3,526,205 | 9/1970 | Rosenheinrich | 118/500 X |
| 3,554,162 | 1/1971 | Cota et al. | 118/715 |
| 3,578,495 | 5/1971 | Pammer et al. | 427/94 |
| 3,666,546 | 5/1972 | Reuter et al. | 427/93 |
| 3,698,354 | 10/1972 | Reuschel et al. | 118/715 |
| 3,701,682 | 10/1972 | Gartman et al. | 156/611 |
| 3,750,620 | 7/1973 | Eversteujn et al. | 118/725 |
| 3,805,735 | 4/1974 | Reuschel et al. | 118/728 |
| 4,096,822 | 6/1978 | Yamawaki et al. | 118/500 X |
| 4,129,090 | 12/1978 | Inaniwa et al. | 118/728 |
| 4,235,841 | 11/1980 | Zimmerman | 422/112 |

Primary Examiner—Evan K. Lawrence
Attorney, Agent, or Firm—George R. Clark; Neil M. Rose; Allen J. Hoover

[57] ABSTRACT

As used in an apparatus for thermal treatment of semiconductors, a treating tube has a flanged portion at one end, near an outlet for a treating gas, and a sealing closure has a cylindrical portion and a flanged portion. The flanged portion of the sealing closure is adapted to be interfitted with the flanged portion of the treating tube so as to seal said end. The sealing closure is removable so as to open said end. The cylindrical portion is adapted to be inserted into the treating tank through said end so as to substantially fill the treating tube, as far as the cylindrical portion extends into the tube, except for a clearance provided around the cylindrical portion, between the cylindrical portion and the treating tube, whereby formation of convection currents in the treating gas is prevented. The flanged portion of the treating tube, a hollow interior of the sealing closure, and the flanged portion of the sealing closure are open to an outer atmosphere when the flanged portions are interfitted.

5 Claims, 4 Drawing Figures

APPARATUS FOR THERMAL TREATMENT OF SEMICONDUCTORS

BACKGROUND OF THE INVENTION

The present invention relates to improved apparatus for thermal treatment of semiconductors in a treating gas.

In conventional apparatus for thermal treatment of semiconductors, a treating tube has a sealing cap mounted on one end of the treating tube, near an outlet of the treating tube for discharge of a treating gas. A substantial portion of the treating tube is heated so as to form a region of uniform heating temperature extending longitudinally within the treating tube.

Since the treating gas at high temperature contacts the inner surface of the sealing cap, heat energy is released from the outer surface of the sealing cap, whereupon energy losses are great. Also, convection currents are formed in the treating gas, because of the temperature difference between the sealing cap and the high-temperature zone within the treating tube. Hence, convection currents are formed between the treating gas cooled within the sealing cap and the treating gas present in the high-temperature zone, in a neck of the treating tube, so as to form a local low-temperature region within the treating tube. As a result, the region of uniform heating temperature extending longitudinally within the treating tube is shortened.

In a copending U.S. patent application filed simultaneously herewith and assigned commonly herewith, it is disclosed that convection-preventing plates may be disposed within a treating tube so as to interrupt currents of the treating gas, whereby the region of uniform heating temperature extending longitudinally within the treating tube is shortened.

SUMMARY OF THE INVENTION

The present invention may be embodied in an apparatus for thermal treatment of semiconductors in a treating gas.

The apparatus comprises a treating tube, which is adapted to hold semiconductors, and which has a flanged portion at one end of the treating tube, near an outlet of the treating tube for the treating gas, and a sealing closure, which has a flanged portion adapted to be interfitted with the flanged portion of the treating tube so as to seal said end, and which is removable from the treating tube so as to open said end.

As improved by this invention, the sealing closure has a cylindrical portion, which is adapted to be inserted into the treating tube through said end so as to substantially fill the treating tube, as far as the cylindrical portion extends into the treating tube, except for a clearance provided around the cylindrical portion, between the cylindrical portion and the treating tube.

The flanged portions of the treating tube and the sealing closure respectively may have tapered interfitting surfaces, planar interfitting surfaces, or spherical interfitting surfaces. Also, the cylindrical portion may be tubular, the cylindrical portion may have a closed end, which is remote from the flanged portion of the sealing closure, and the cylindrical portion may have a hollow interior, which is open to an outer atmosphere. The opposite surfaces of the flanged portions are exposed to the outer atmosphere when the flanged portions are interfitted with each other.

The outlet may be located in the treating tube so as to confine the treating gas within the clearance around the cylindrical portion as the treating gas flows to the outlet.

The present invention will be described in detail below with reference to embodiments illustrated in the accompanying drawings.

DETAILED DESCRIPTION OF PREFERRED EMBODIMENTS

Figure 1:
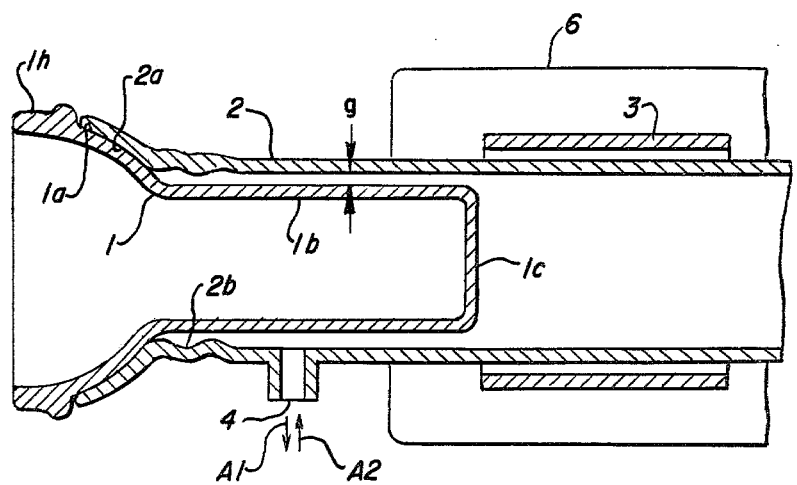
FIGS. 1 through 3 are similar, fragmentary, longitudinal, sectional views of three alternative embodiments of the present invention.
Figure 2:
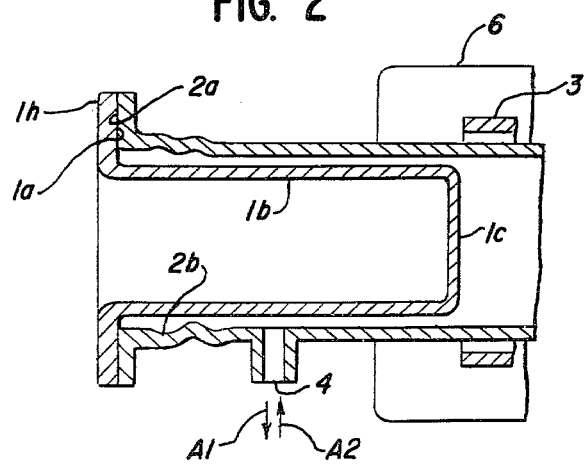
Figure 3:
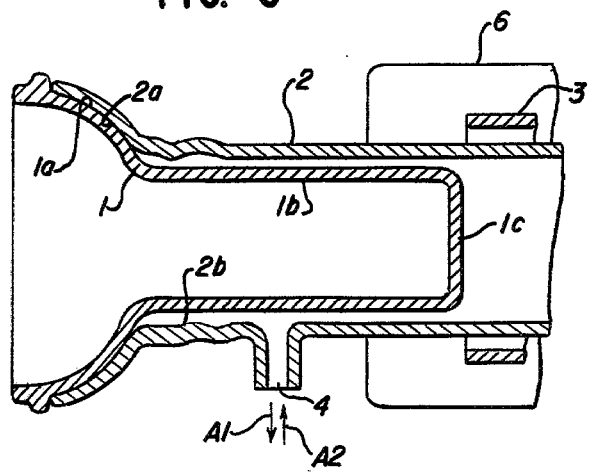

In each embodiment of FIGS. 1 through 3, an apparatus for thermal treatment of semiconductors in a treating gas comprises a treating tube 2, which is adapted to hold semiconductors (not shown) to be treated, and which has a flanged portion 2a at one end of the treating tube 2, near an outlet 4 of the treating tube 2 for the treating gas, and a sealing closure 1, which has a flanged portion 1a adapted to be interfitted with the flanged portion of the treating tube so as to seal said end, and which is removable from the treating tube 2 so as to open said end.

The sealing closure 1 has a cylindrical portion 1b, which is tubular as shown, and which is adapted to be inserted into the treating tube 2 so as to fill the treating tube, as far as the cylindrical portion 1b extends into the treating tube 2, except for a clearance provided around the cylindrical portion 1b, between the cylindrical portion 1b and the treating tube 2, as indicated at g in FIG. 1. The sealing closure 1 has a head portion 1h extending longitudinally beyond the flanged portion 2a of the treating tube 2, of which a terminal portion 2b has a wavy sectional shape near the flanged portion 2a. The extending portion of the treating tube 2 includes the terminal portion 2b.

A heater 3 is disposed around a substantial portion of the treating tube 2, and the heater 3 is covered by a heat-insulating member 6. An extending portion of the treating tube 2 extends from the heat-insulating member 6 so as to be exposed to the outer atmosphere. The flanged portion 2a is provided on the extending portion of the treating tube 2.

Preferably, the treating gas is introduced into the treating tube 2 through an inlet (not shown) near the opposite end of the treating tube 2 and is discharged from the treating tube 2 through an orifice 4 constituting an outlet in the lateral wall of the extending portion of the treating tube 2, as indicated by arrow $A_1$. For some processes of chemical vapor deposition (CVD) in the apparatus of FIG. 1, good results often are obtained when the treating gas is introduced into the treating tube 2 through the orifice 4, as indicated by arrow $A_2$.

Semiconductors (not shown) as exemplified by wafers of silicon on a boat (not shown) may be inserted into the treating tube 2, through its left end as shown, so as to be disposed in the region of uniform heating temperature within the treating tube 2, where the semiconductors are heated to a predetermined high temperature by the heater 3.

In the embodiment of FIG. 1, the flanged portion 2a of the treating tube 2 and the flanged portion 1a of the sealing closure 1 have tapered interfitting surfaces. In the embodiment of FIG. 2, the flanged portion 2a of the treating tube 2 and the flanged portion 1a of the sealing closure 1 have planar interfitting surfaces. In the embodiment of FIG. 3, the flanged portion 2a of the treating tube 2 and the flanged portion 1a of the sealing closure 1 have spherical interfitting surfaces. In each embodiment, the interfitting surfaces are matched, and finished by known processing techniques, so as to enable a hermetic seal to be effected between the sealing closure 1 and the treating tube 2.

Figure 4:
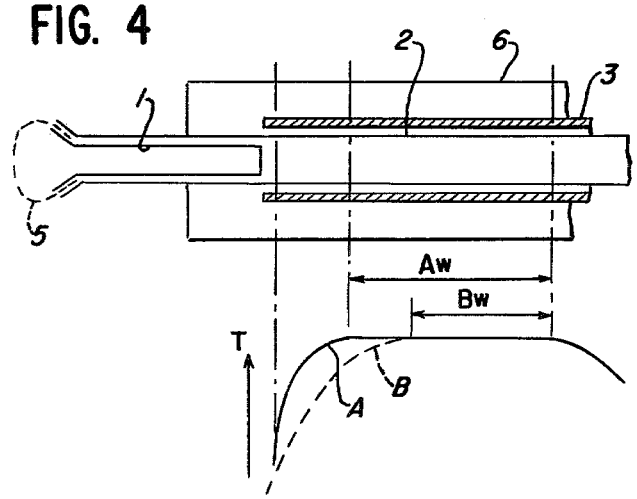
FIG. 4 is a diagram illustrating characteristics of such embodiments as compared with characteristics of conventional apparatus.

Common characteristics of the embodiments of FIGS. 1 through 3 are diagrammed in FIG. 4, wherein the characteristics of conventional apparatus comprising a sealing cap 5 in place of such a closure 1 but being comparable in other respects also are diagrammed, for comparative purposes. In FIG. 4, the temperature within the treating tube 2 as a function of longitudinal position is indicated by curve A for the embodiments of FIGS. 1 through 3, and by curve B for conventional apparatus employing such a cap 5. In FIG. 4, the length of the region of uniform heating temperature within the treating tube 2 is indicated by length Aw for the embodiments of FIGS. 1 through 3, and by length Bw for conventional apparatus.

It is to be noted that the present invention allows substantially greater length to be obtained for the region of uniform heating temperature than can be obtained in conventional apparatus employing such a cap 5. Also, the present invention allows a greater length to be obtained for the region of uniform heating temperature than can be obtained if such a cap 5 is used with five convection-preventing plates, as disclosed in the copending application mentioned above.

Pursuant to the present invention, formation of convection currents is prevented by effective elimination of a space wherein convection currents tend to be induced, as the space is filled effectively by the cylindrical portion 1b of the sealing closure 1. The treating gas does not move readily within the clearance around the cylindrical portion 1b of the sealing closure 1.

Furthermore, the head portion 1h of the sealing closure 1 is shorter in a longitudinal direction than such a cap 5 of conventional apparatus, and the temperature of the head portion 1h is lower than the temperature of such a cap 5, whereupon heat losses from the sealing closure 1 are small. From experimental results, it has been confirmed that the consumption of electric power can be reduced by 30%. Because of the specific shape of the sealing closure 1, holding and aligning of the sealing closure 1 can be remarkably facilitated, and the sealing closure 1 can be very easily fitted into the treating tube 2.

Furthermore, adherence of dust either on the terminal portion 2b or on the flanged portion 2a of the treating tube 2 when a boat either is inserted or is withdrawn is present in a substantial measure by the wavy sectional shape of the terminal portion 2b of the treating tube 2.

Moreover, the bottom portion 1c of the sealing closure 1 is located at the innermost end of the sealing closure 1 within the treatment tube 2, and it may be said that the outer atmosphere within the sealing closure 1 forms a gaseous mass that does not readily flow.

Consumption of electric power can be reduced, since the closure 1 including the flanged portion 1a, the cylindrical portion 1b, and the bottom portion 1c is fitted into an end portion of the treating tube 2, since the clearance between the cylindrical portion 1b and the treating tube 2 is small and the treating gas scarcely flows within said clearance, and since heat energy carried away from the sealing closure 1 is small and heat loss from the exposed portion of the treating tube 2 can be reduced.

Moreover, the temperature of the inner face of the bottom portion 1c of the sealing closure 1, as faces into the treating tube 2, is substantially uniform across the cross-section of the treating tube 2, and the difference between said temperature and the temperature within the treating tube 2 is small. Accordingly, no internal convection currents are produced in the treating tube 2, whereby formation of a local low-temperature region within the treating tube 2 is prevented and whereby the length of the region of uniform heating temperature is increased.

The flanged portion 2a of the treating tube 2 is cooled, from both its inner and outer surfaces, and the temperature of the flanged portion 2a thus is low. Therefore, the temperature difference between the flanged portion 1a of the sealing closure 1 and the flanged portion 2a of the treating tube 2 is small, whereupon biting of the interfitting surfaces can be prevented, and whereupon gas tightness can be enhanced by provision of a packing member (not shown) of Teflon polytetrafluoroethylene, heat-resistant rubber, or like material.

I claim:
1. In an apparatus for thermal treatment of semiconductors in a treating gas, of a type comprising
    (a) a treating tube, which is adapted to hold semiconductors, which has a tubular wall, which has a flanged portion located at one end of the tubular wall and exposed to an outer atmosphere, and which has an outlet provided in the tubular wall for the treating gas and spaced from the flanged portion, and
    (b) a sealing closure, which has a flanged portion adapted to be interfitted with the flanged portion of the treating tube so as to seal said end, and which is removable from the treating tube so as to open said end, the improvement wherein the sealing closure has a cylindrical portion, which has a tubular wall, and which is adapted to be inserted into the treating tube through said end so as to substantially fill the treating tube, as far as the cylindrical portion extends into the treating tube, except for a clearance provided around the cylindrical portion, between the cylindrical portion and the tubular wall of the treating tube, said clearance preventing ready formation of convection currents in the treating gas, and wherein the tubular wall of the cylindrical portion of the sealing closure has a first end, which is open, and which adjoins the flanged portion of the sealing closure, a second end, which is closed, and a hollow interior, which is open to the outer atmosphere at the first end through the flanged portion of the sealing closure, and which does not communicate through the sealing closure with the outlet for the treating gas, the flanged portion of the sealing closure and the flanged portion of the treating tube each having a surface to be interfitted with a surface of the other, and each having a surface opposite its surface to be interfitted, said opposite surfaces being exposed to the outer atmosphere when said flanged portions are interfitted with each other.

2. The improvement of claim 1 wherein the flanged portions of the treating tube and the sealing closure respectively have tapered interfitting surfaces.

3. The improvement of claim 1 wherein the flanged portions of the treating tube and the sealing closure respectively have planar interfitting surfaces.

4. The improvement of claim 1 wherein the flanged portions of the treating tube and the sealing closure respectively have spherical interfitting surfaces.

5. The improvement of any one of claims 1 through 4 wherein the outlet for the treating gas is located in the tubular wall of the treating tube, at a location where the treating tube is filled by the cylindrical portion of the sealing closure except for the clearance provided around the cylindrical portion of the sealing closure, so as to confine the treating gas within the clearance around the cylindrical portion of the sealing closure as the treating tube flows to the outlet.

* * * * *